(12) United States Patent
Hu et al.

(10) Patent No.: US 10,515,885 B2
(45) Date of Patent: Dec. 24, 2019

(54) METHOD OF FABRICATING A FLEXIBLE DISPLAY SCREEN HAVING SUBSTRATE WITH A PLURALITY OF PINS INSERTED IN THE THROUGH HOLES OF LAMINATION PLATE

(71) Applicant: Wuhan China Star Optoelectronics Semiconductor Display Technology Co., Ltd., Wuhan, Hubei (CN)

(72) Inventors: Lei Hu, Hubei (CN); Szu Yuan Wang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 156 days.

(21) Appl. No.: 15/579,479

(22) PCT Filed: Nov. 28, 2017

(86) PCT No.: PCT/CN2017/113347
§ 371 (c)(1),
(2) Date: Dec. 4, 2017

(87) PCT Pub. No.: WO2019/095434
PCT Pub. Date: May 23, 2019

(65) Prior Publication Data
US 2019/0229297 A1     Jul. 25, 2019

(30) Foreign Application Priority Data
Nov. 15, 2017   (CN) .......................... 201711132425.8

(51) Int. Cl.
*H01L 21/00*     (2006.01)
*H01L 51/40*     (2006.01)
(Continued)

(52) U.S. Cl.
CPC ........ *H01L 23/49827* (2013.01); *B32B 3/266* (2013.01); *B32B 7/12* (2013.01);
(Continued)

(58) Field of Classification Search
CPC ........... H01L 23/49827; H01L 23/5384; H01L 51/56; H01L 27/3244; H01L 51/0097; B32B 3/266; B32B 7/12; B32B 37/12
See application file for complete search history.

(56) References Cited

U.S. PATENT DOCUMENTS 9,713,918 B1 *    7/2017   Mu .................... B32B 43/006
2004/0198101 A1   10/2004  Rapp
(Continued)

FOREIGN PATENT DOCUMENTS

CN          2514449         10/2002
CN        101676769 A        3/2010
(Continued)

*Primary Examiner* — Alonzo Chambliss
(74) *Attorney, Agent, or Firm* — Hemisphere Law, PLLC; Zhigang Ma

(57) ABSTRACT

The disclosure provides a lamination method for a flexible display screen, including: providing a flexible display screen, the flexible display screen including two first through-holes located in a non-display region thereof and arranged diagonally; providing a flexible lamination plate, the flexible lamination plate including two second through-holes, and the two second through-holes arranged diagonally; providing a lamination device, the lamination device including a rigid substrate and two location pins located on the rigid substrate, and the two location pin arranged diagonally; disposing the flexible lamination plate on the rigid substrate and allowing the two location pins to penetrate the two second through-holes, respectively; disposing the flexible display screen on the flexible lamination plate and allowing the two location pins to also penetrate the two first
(Continued)

through-holes, respectively, thereby laminating the flexible display screen and the flexible lamination plate together.

10 Claims, 4 Drawing Sheets

(51) Int. Cl.

| | |
|---|---|
| *H01L 33/00* | (2010.01) |
| *H01L 31/0203* | (2014.01) |
| *H01L 23/498* | (2006.01) |
| *H01L 51/56* | (2006.01) |
| *H01L 51/00* | (2006.01) |
| *H01L 27/32* | (2006.01) |
| *B32B 37/12* | (2006.01) |
| *B32B 3/26* | (2006.01) |
| *B32B 7/12* | (2006.01) |
| *H01L 51/52* | (2006.01) |

(52) U.S. Cl.
CPC .......... *B32B 37/12* (2013.01); *H01L 27/3244* (2013.01); *H01L 51/0097* (2013.01); *H01L 51/56* (2013.01); *B32B 2307/42* (2013.01); *B32B 2307/422* (2013.01); *B32B 2457/206* (2013.01); *H01L 51/5253* (2013.01); *H01L 51/5281* (2013.01); *H01L 2227/323* (2013.01); *H01L 2251/5338* (2013.01)

(56) References Cited

U.S. PATENT DOCUMENTS

| | | | |
|---|---|---|---|
| 2011/0254031 A1* | 10/2011 | Yan | .......................... H01L 33/08 257/98 |
| 2014/0246655 A1* | 9/2014 | Chen | ....................... H01L 51/56 257/40 |

FOREIGN PATENT DOCUMENTS

| | | |
|---|---|---|
| CN | 101980393 | 2/2011 |
| CN | 102376210 A | 3/2012 |
| CN | 102596565 | 7/2012 |
| CN | 102749736 A | 10/2012 |
| CN | 105185813 | 12/2015 |
| CN | 2055416955 | 8/2016 |
| CN | 205674652 | 11/2016 |
| CN | 106356472 | 1/2017 |

* cited by examiner

METHOD OF FABRICATING A FLEXIBLE DISPLAY SCREEN HAVING SUBSTRATE WITH A PLURALITY OF PINS INSERTED IN THE THROUGH HOLES OF LAMINATION PLATE

RELATED APPLICATIONS

The present application is a National Phase of International Application Number PCT/CN2017/113347, filed Nov. 28, 2017, and claims the priority of China Application No. 201711132425.8, filed Nov. 15, 2017.

FIELD OF THE DISCLOSURE

The disclosure relates to the field of display screen production, and particularly to a lamination method for a flexible display screen and a lamination device for the flexible display screen.

BACKGROUND

As the development of OLED display technology is increasingly mature, a number of consumers experience the great differences between OLED display and conventional LCD display, with a consequent rapid increase in OLED consuming market.

Due to self luminous property of OLED, it is hard to attain many performances such as short response time, high contrast, wide viewing angle, wide color gamut, lightening and thinning, and bendability. In particularly, the bendability of OLED display panels brings a subversive concept to consumers, and thus the flexible OLED display panel becomes development mainstream of OLED in recent years. The flexible OLED display panel is generally formed by bonding a display portion and a foam portion together through optical adhesive and the like. Since the display portion uses polyimide resin as a substrate, and polyimide resin has the same thickness as foam and very thin and soft, which increases the difficulty of lamination process during lamination, and influences on lamination accuracy, thereby reducing production efficiency.

SUMMARY

In order to solve the above problems in the prior art; the disclosure provides a lamination method for a flexible display screen and a lamination device for the flexible display screen, thereby improving lamination accuracy and increasing production efficiency.

According to an aspect of the disclosure, the disclosure provides a lamination method for a flexible display screen, including; providing a flexible display screen, the flexible display screen including two first through-holes located in a non-display region thereof, and the two first through-holes arranged diagonally; providing a flexible lamination plate; the flexible lamination plate including two second through-holes, and the two second through-holes arranged diagonally; providing a lamination device, the lamination device including a rigid substrate and two location pins located on the rigid substrate, and the two location pin arranged diagonally; disposing the flexible lamination plate on the rigid substrate and allowing the two location pins to penetrate the two second through-holes, respectively; disposing the flexible display screen on the flexible lamination plate and allowing the two location pins to also penetrate the two first through-holes, respectively, thereby laminating the flexible display screen and the flexible lamination plate together.

Further, the flexible lamination plate includes an foam plate and an flexible back plate, and the flexible back plate is disposed on the foam plate and adhesively secured to the foam plate via optical adhesive, and the second through-hole penetrates the foam plate and the flexible back plate; wherein when the flexible lamination plate is disposed on the rigid substrate, the foam plate faces the rigid substrate.

Further, the flexible display screen includes a flexible substrate; an array layer formed on the flexible substrate, the array layer including several thin-film transistors arranged in an array; an organic electroluminescent layer formed on the array layer; a package layer formed on the organic electroluminescent layer; a polarizing filter, including a horizontal part and a vertical part formed by bending side ends of the horizontal part, and the horizontal part is disposed on the package layer, the vertical part is disposed on the array layer, and the first through-hole penetrates the flexible substrate, the array layer and the vertical part; wherein when the flexible display screen is disposed on the flexible lamination plate, the flexible substrate faces the flexible back plate.

Further, the flexible substrate and the flexible back plate are adhesively secured using an optical adhesive.

Further, the flexible substrate is made of polyimide resin.

Further, the first through-hole and/or the second through-hole have a bore diameter less than 100 μm.

According to another aspect of the disclosure, the disclosure also provides a lamination device for a flexible display screen, including: a flexible display screen, the flexible display screen including two first through-holes located in a non-display region thereof, the two first through-holes arranged diagonally; a flexible lamination plate, the flexible lamination plate including two second through-holes, the two second through-holes arranged diagonally; a lamination device, the lamination device including a rigid substrate and two location pins located on the rigid substrate, the two location pins arranged diagonally; wherein the flexible lamination plate is disposed on the rigid substrate so that the two location pins penetrate the two second through-holes, respectively; the flexible display screen is disposed on the flexible lamination plate so that the two location pins also penetrate the two first through-holes, respectively, thereby laminating the flexible display screen and the flexible lamination plate together.

Further, the flexible lamination plate includes an foam plate and an flexible back plate, and the flexible back plate is disposed on the foam plate and adhesively secured to the foam plate via an optical adhesive, and the second through-hole penetrates the foam plate and the flexible back plate; wherein when the flexible lamination plate is disposed on the rigid substrate, the foam plate is located between the rigid substrate and the flexible back plate.

Further, the flexible display screen includes a flexible substrate; an array layer formed on the flexible substrate, the array layer including several thin-film transistors arranged in an array; an organic electroluminescent layer formed on the array layer; a package layer formed on the organic electroluminescent layer; a polarizing filter, including a horizontal part and a vertical part formed by bending side ends of the horizontal part, and the horizontal part is disposed on the package layer, the vertical part is disposed on the array layer, and the first through-hole penetrates the flexible substrate, the array layer and the vertical part; wherein when the flexible display screen is disposed on the flexible lamination plate, the flexible back plate is located between the flexible substrate and the foam plate.

Further, the flexible substrate and the flexible back plate are adhesively secured via the optical adhesive.

The advantageous effect of the disclosure are that the lamination method of the disclosure can precisely secure a flexible display screen to a flexible lamination plate via the location pin, so that a lamination process for the flexible display screen is completed in the premise that accuracy is met, thereby greatly reducing operational difficulty and improving production efficiency.

BRIEF DESCRIPTION OF THE DRAWINGS

The above and other aspects, features and advantages of embodiments of the disclosure will become clearer by the following description in conjunction with the accompanying drawings, in which.

DETAILED DESCRIPTION OF PREFERRED EMBODIMENTS

Figure 1:
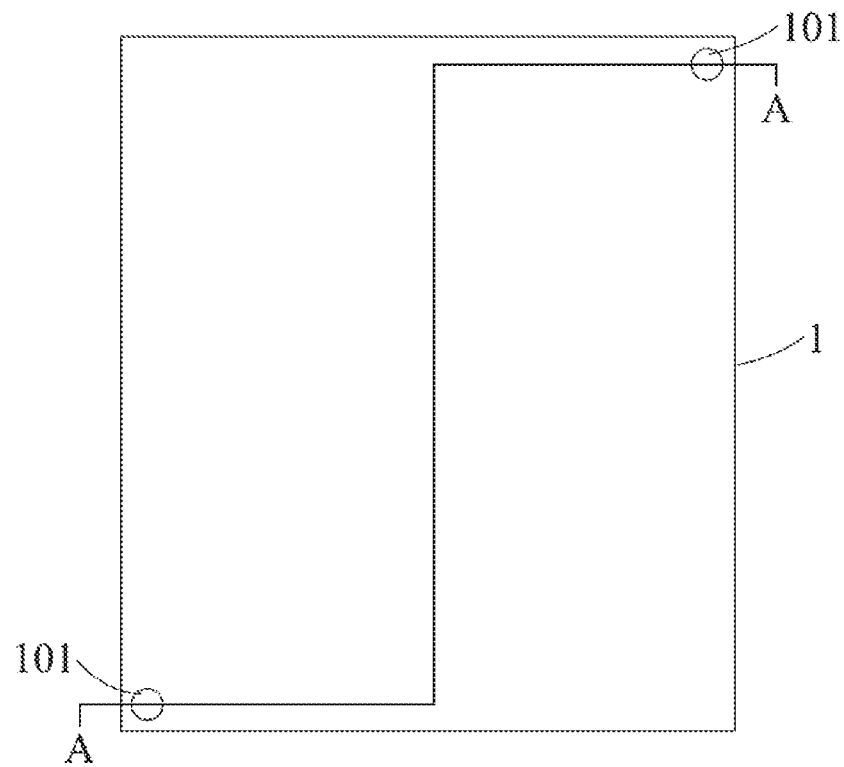
FIG. 1 is a front view of a flexible display screen according to an embodiment of the disclosure.

The embodiments of the disclosure are described below in detail in combination with the accompanying drawings. The disclosure, however, may be embodied in various different forms, and should not be construed as being limited to the illustrated specific embodiments herein. Rather, these embodiments are provided to explain principles of the disclosure and actual application thereof, so that a person skilled in the art can understand the various embodiments of the disclosure and various modifications used for the particular intended application.

In the drawings, the thickness of layers and regions may be exaggerated for clarity. Like reference numerals designate like elements throughout the description and the accompanying drawings.

Figure 2:
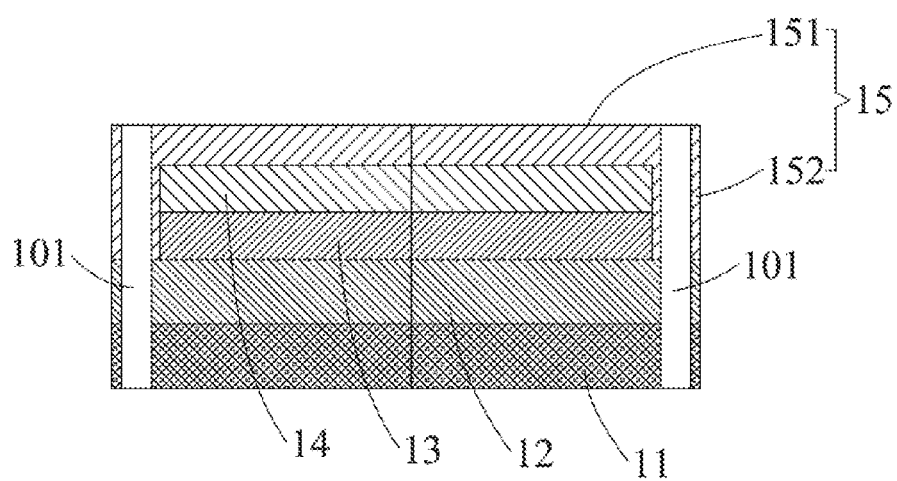
FIG. 2 is a cross-sectional view taken along line A-A in FIG. 1.

FIG. 1 is a front view of a flexible display screen according to an embodiment of the disclosure. FIG. 2 is a cross-sectional view taken along line A-A in FIG. 1.

With reference to FIG. 1, a flexible display screen 1 according to an embodiment of the disclosure includes a display region, a non-display region surrounding the display region and two first through-holes 101 located in the non-display region. Generally, the flexible display screen is in the form of rectangle, and one of the two first through-holes 101 is located at a corner of the flexible display screen 1, and the other of the two first through-holes 101 is located at other corner of the flexible display screen 1, and the corner and the other corner are located in one of diagonal lines of the rectangle. Namely, the two first through-holes 101 are located one of the diagonal lines of the rectangle, that is to say, the two first through-holes 101 are arranged diagonally.

In addition, the first through-hole 101 has a diameter less than 100 µm. However, the disclosure is not limited thereto.

Further, with reference to FIG. 2, the flexible display screen 1 includes a flexible substrate 11, an array layer 12, an organic electroluminescent layer 13, a package layer 14 and a polarizing filter 15.

The flexible substrate 11 may be made of polyimide resin, but the disclosure is not limited thereto. The flexible substrate 11 may also be made of other flexible materials.

The array layer 12 is formed on the flexible substrate 11. Generally, the array layer 12 includes several thin-film transistors (not shown) arranged in an array and the desired circuits and the like.

The organic electroluminescent layer 13 is formed on the array layer 12. The organic electroluminescent layer 13 is used for light-emitting display. Generally, an area at which the organic electroluminescent layer 13 is located is the display region, and other areas are the non-display region.

The package layer 14 is formed on the organic electroluminescent layer 13. The package layer 14 is generally used for protecting the organic electroluminescent layer 13 from water and oxygen and the like.

The polarizing filter 15 includes a horizontal part 151 and a vertical part 152, and the vertical part 152 is formed by bending side ends (ends of the opposite sides) of the horizontal part 151. The horizontal part 151 is disposed on the package layer 14, and the vertical part 152 is disposed on the array layer 12. In this way, the vertical part 152 is located in the non-display region. The first through-hole 101 penetrates the flexible substrate 11, the array layer 12 and the vertical part 152.

It should be noted that the number of the first through-hole 101 is not limited to two. For example, the number may be three or four. But, two first through-holes 101 are minimum quantity.

Figure 3:
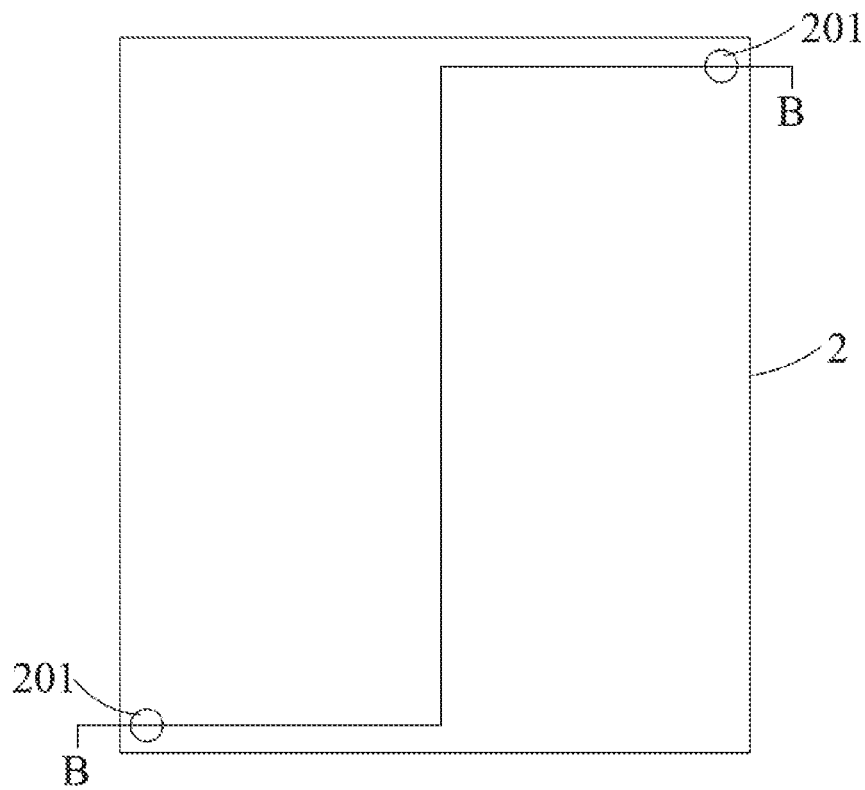
FIG. 3 is a front view of a flexible display screen according to an embodiment of the disclosure.
Figure 4:
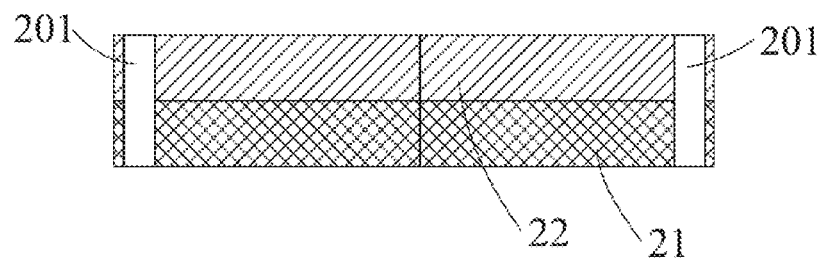
FIG. 4 is a cross-sectional view taken along line B-B in FIG. 3.

FIG. 3 is a front view of a flexible display screen according to an embodiment of the disclosure. FIG. 4 is a cross-sectional view taken along line B-B in FIG. 3.

With reference to FIG. 3, a flexible lamination panel 2 according to an embodiment of the disclosure includes two second through-holes 201. Generally, the flexible lamination panel 2 is in the form of rectangle, and one of the two second through-holes 201 is located at a corner of the flexible lamination panel 2, and the other of the two second through-holes 201 is located at the other corner of the flexible lamination panel 2, and the corner and the other corner are located in one of diagonal lines of the rectangle. That is to say, the two second through-holes 201 are located in one of the diagonal lines of the rectangle, namely the two second through-holes 201 are arranged diagonally. In addition, the second through-hole 201 has a diameter less than 100 µm. However, the disclosure is not limited thereto.

Further, with reference to FIG. 4, the flexible lamination plate 2 includes a foam plate 21 and a flexible back plate 22. The flexible back plate 22 is disposed on the foam plate 21 and adhesively secured to the foam plate 21 by means of an optical adhesive. The second through-hole 201 penetrates the foam plate 21 and the flexible back plate 22.

Figure 5:
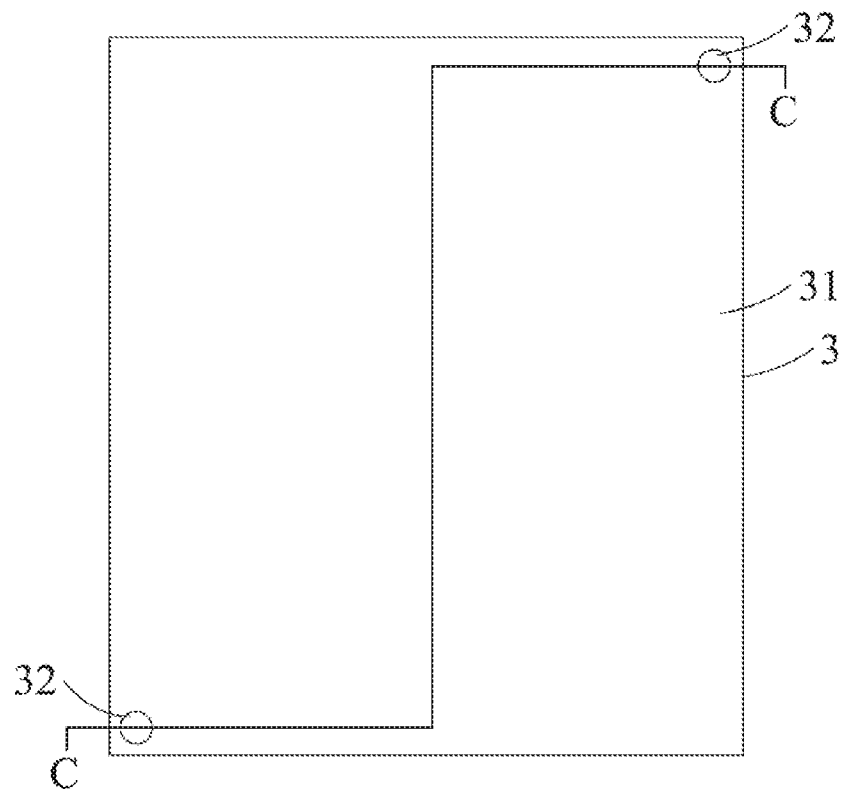
FIG. 5 is a front view of a lamination device according to an embodiment of the disclosure.
Figure 6:
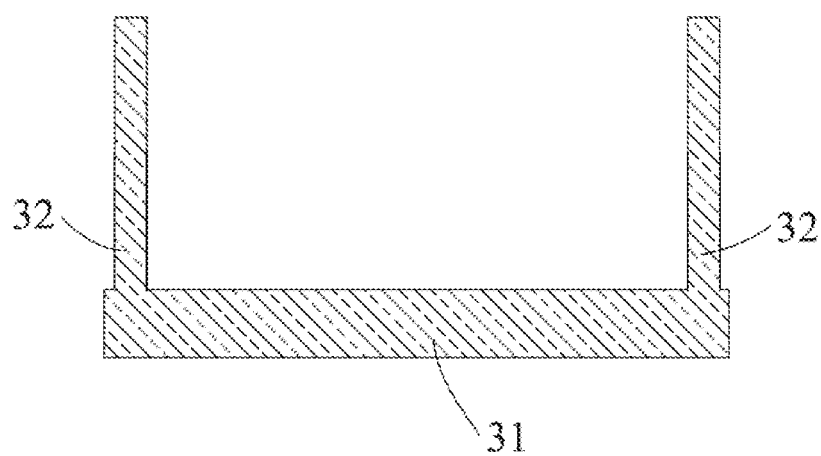
FIG. 6 is a cross-sectional view taken along line C-C in FIG. 5.

FIG. 5 is a front view of a lamination device according to an embodiment of the disclosure. FIG. 6 is a cross-sectional view taken along line C-C in FIG. 5.

With reference to FIG. 5 and FIG. 6, a lamination device 3 according to an embodiment of the disclosure includes a rigid substrate 31 and two location pins 32 located on the rigid substrate 31. Generally, the rigid substrate 31 is in the form of rectangle, and one of the two location pins 32 is located at a corner of the rigid substrate 31, and the other of the two location pins 32 is located at the other corner of the rigid substrate 31, and the corner and the other corner are located in one of diagonal lines of the rectangle. That is to say, the two location pins 32 are located in one of the diagonal lines of the rectangle, namely the two location pins 32 are arranged diagonally. In addition, the location pin 32 has a diameter less than the diameter of the first through-hole 101 and the second through-hole 201.

Additionally, the embodiment also provides a lamination device for the flexible display screen including the flexible display screen 1 shown in FIG. 1, the flexible lamination plate 2 shown in FIG. 2 and the lamination device 3 shown in FIG. 3.

Figure 7:
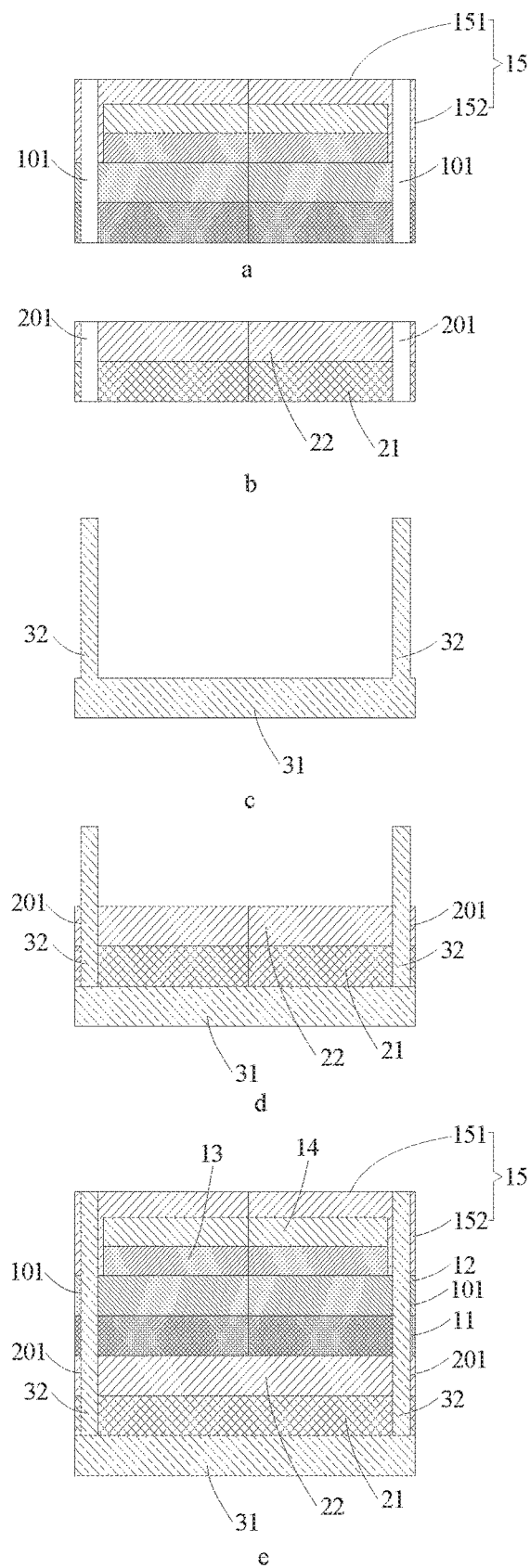
FIG. 7 is a flow chart of a lamination method for a flexible display screen according to an embodiment of the disclosure.

FIG. 7 is a flow chart of a lamination method for a flexible display screen according to an embodiment of the disclosure.

With reference to FIG. 7, a lamination method for the flexible display screen according to an embodiment of the disclosure includes step 1 to step 5.

Specifically, step 1 is carried out firstly. With reference to FIG. a in FIG. 7, the flexible display screen 1 as shown in FIG. 1 and FIG. 2 is provided. After finishing the step 1, step 2 is carried out.

In the step 2, with reference to FIG. b in FIG. 7, the flexible lamination plate 2 as shown in FIG. 3 and FIG. 4 is provided. After finishing the step 2, step 3 is carried out.

In the step 3, with reference to FIG. c in FIG. 7, the lamination device 3 as shown in FIG. 5 and FIG. 6 is provided. After finishing the step 3, step 4 is carried out.

In the step 4, with reference to FIG. d in FIG. 7, the flexible lamination plate 2 is disposed on the rigid substrate 31 so that one of the two location pins 32 penetrates one of the two second through-holes 201, and the other of the two location pins 32 penetrates the other of the two second through-holes 201. Here, the foam plate 21 is facing the rigid substrate 31. After finishing the step 4, step 5 is carried out.

In the step 5, with reference to FIG. e in FIG. 7, the flexible display screen 1 is disposed on the flexible lamination plate 2 so that one of the two location pins 32 penetrates one of the two first through-holes 101, and the other of the two location pins 32 penetrates the other of the two first through-holes 101. Here, the flexible substrate 11 is facing the flexible lamination plate 2.

In this way, after carrying out the step 1 to the step 5, the surface of the flexible back plate 22 facing away from the foam plate 21 has an optical adhesive. When disposed on the flexible back plate 22, the flexible substrate 11 is secured to the flexible back plate 22 via the optical adhesive, thereby achieving the securing between the flexible display screen 1 and the flexible lamination plate 2.

In summary, the lamination method for the flexible display screen according to embodiments of the disclosure can secure a flexible display screen to a flexible lamination plate via a location pin so that a lamination process for the flexible display screen is completed in the premise that accuracy is met, thereby greatly reducing operational difficulty and improving production efficiency.

Although the disclosure has been described with reference to the specific embodiments and drawings, it is to be understood by a person skilled in the art that the various changes in the forms and details may be made without departing from the spirit and the scope of the disclosure defined by the claims and the equivalents thereof.

What is claimed is:

1. A lamination method for a flexible display screen, comprising:

providing a flexible display screen, the flexible display screen comprising two first through-holes located in a non-display region thereof, and the two first through-holes arranged diagonally;

providing a flexible lamination plate, the flexible lamination plate comprising two second through-holes, and the two second through-holes arranged diagonally;

providing a lamination device, the lamination device comprising a rigid substrate and two location pins located on the rigid substrate, and the two location pin arranged diagonally;

disposing the flexible lamination plate on the rigid substrate and allowing the two location pins to penetrate the two second through-holes, respectively;

disposing the flexible display screen on the flexible lamination plate and allowing the two location pins to also penetrate the two first through-holes, respectively, thereby laminating the flexible display screen and the flexible lamination plate together.

2. The lamination method according to claim 1, wherein the flexible lamination plate comprises an foam plate and an flexible back plate, and the flexible back plate is disposed on the foam plate and adhesively secured to the foam plate via optical adhesive, and the second through-hole penetrates the foam plate and the flexible back plate; wherein when the flexible lamination plate is disposed on the rigid substrate, the foam plate faces the rigid substrate.

3. The lamination method according to claim 2, wherein the flexible display screen comprises a flexible substrate; an array layer formed on the flexible substrate, the array layer comprising several thin-film transistors arranged in an array; an organic electroluminescent layer formed on the array layer; a package layer formed on the organic electroluminescent layer; a polarizing filter, comprising a horizontal part and a vertical part formed by bending side ends of the horizontal part, and the horizontal part is disposed on the package layer, the vertical part is disposed on the array layer, and the first through-hole penetrates the flexible substrate, the array layer and the vertical part; wherein when the flexible display screen is disposed on the flexible lamination plate, the flexible substrate faces the flexible back plate.

4. The lamination method according to claim 3, wherein the flexible substrate and the flexible back plate are adhesively secured using an optical adhesive.

5. The lamination method according to claim 1, wherein the first through-hole and/or the second through-hole have a bore diameter less than 100 μm.

6. A lamination device for a flexible display screen, comprising:

a flexible display screen, the flexible display screen comprising two first through-holes located in a non-display region thereof, the two first through-holes arranged diagonally;

a flexible lamination plate, the flexible lamination plate comprising two second through-holes, the two second through-holes arranged diagonally;

a lamination device, the lamination device comprising a rigid substrate and two location pins located on the rigid substrate, the two location pins arranged diagonally;

wherein the flexible lamination plate is disposed on the rigid substrate so that the two location pins penetrate the two second through-holes, respectively; the flexible display screen is disposed on the flexible lamination plate so that the two location pins also penetrate the two first through-holes, respectively, thereby laminating the flexible display screen and the flexible lamination plate together.

7. The lamination device for the flexible display screen according to claim 6, wherein the flexible lamination plate comprises an foam plate and an flexible back plate, and the flexible back plate is disposed on the foam plate and adhesively secured to the foam plate via an optical adhesive, and the second through-hole penetrates the foam plate and the flexible back plate; wherein when the flexible lamination plate is disposed on the rigid substrate, the foam plate is located between the rigid substrate and the flexible back plate.

8. The lamination device for the flexible display screen according to claim 7, wherein the flexible display screen comprises a flexible substrate; an array layer formed on the flexible substrate, the array layer comprising several thin-film transistors arranged in an array; an organic electroluminescent layer formed on the array layer; a package layer formed on the organic electroluminescent layer; a polarizing filter, comprising a horizontal part and a vertical part formed by bending side ends of the horizontal part, and the horizontal part is disposed on the package layer, the vertical part is disposed on the array layer, and the first through-hole penetrates the flexible substrate, the array layer and the vertical part; wherein when the flexible display screen is disposed on the flexible lamination plate, the flexible back plate is located between the flexible substrate and the foam plate.

9. The lamination device for the flexible display screen according to claim 8, wherein the flexible substrate and the flexible back plate are adhesively secured via the optical adhesive.

10. The lamination device for the flexible display screen according to claim 6, wherein the first through-hole and/or the second through-hole have a bore diameter less than 100 µm.

* * * * *